(12) United States Patent
Miyazaki et al.

(10) Patent No.: US 7,096,139 B2
(45) Date of Patent: Aug. 22, 2006

(54) TESTING APPARATUS

(75) Inventors: Masashi Miyazaki, Tokyo (JP); Kenji Inaba, Tokyo (JP); Toshiyuki Miura, Tokyo (JP)

(73) Assignee: Advantest Corporation, Tokyo (JP)

( * ) Notice: Subject to any disclaimer, the term of this patent is extended or adjusted under 35 U.S.C. 154(b) by 50 days.

(21) Appl. No.: 10/780,286

(22) Filed: Feb. 17, 2004

(65) Prior Publication Data

US 2005/0182583 A1    Aug. 18, 2005

(51) Int. Cl.
*G01R 31/00* (2006.01)
(52) U.S. Cl. .................. 702/117; 702/108; 702/118; 702/120; 324/73.1
(58) Field of Classification Search ............... 702/117, 702/57–59, 108, 118, 120, 121, 189, 124–126; 324/512, 500, 527, 537, 763–765, 555, 73.1; 714/25, 27, 30, 32, 718, 724, 726, 727, 733, 714/734, 740, 742, 744; 365/201
See application file for complete search history.

(56) References Cited

U.S. PATENT DOCUMENTS

| | | | | |
|---|---|---|---|---|
| 5,638,383 | A | * | 6/1997 | Wotzak et al. ............. 714/733 |
| 5,777,873 | A | * | 7/1998 | Cox et al. ..................... 700/79 |
| 6,101,457 | A | * | 8/2000 | Barch et al. ................ 702/117 |
| 2003/0009715 | A1 | * | 1/2003 | Ricchetti et al. ............ 714/727 |

FOREIGN PATENT DOCUMENTS

| | | |
|---|---|---|
| JP | 60-135777 | 7/1985 |
| JP | 63-298174 | 12/1988 |
| JP | 2001-51026 | 2/2001 |
| JP | 2002-131392 | 5/2002 |

OTHER PUBLICATIONS

Translation of JP-2002-131392.*
Translation of JP-60-135777.*
Translation of JP-63-298174.*
International Search Report Issued for PCT/JP2005/002350 mailed on May 31, 2005, 6 pages.

* cited by examiner

*Primary Examiner*—Hal Wachsman
(74) *Attorney, Agent, or Firm*—Osha-Liang LLP (57) ABSTRACT

A testing apparatus having testing module slots onto which different types of testing modules are selectively mounted includes controlling modules for supplying control signals to the testing modules mounted on the testing module slots. The control signals are used for controlling the testing module. The apparatus also includes a setting information supplying unit for supplying hardware setting information to a specific testing module, an enable signal controlling unit for instructing the specific testing module to generate and supply an enable signal to the controlling module corresponding to the specific testing module, and a setting unit for setting the controlling module received said enable signal from the specific testing module so as to supply the control signal corresponding to the specific testing module based on the hardware setting information.

9 Claims, 4 Drawing Sheets

TESTING APPARATUS

BACKGROUND OF THE INVENTION

1. Field of the Invention

The present invention relates to a testing apparatus. More particularly, the present invention relates to a testing apparatus including a plurality of testing module slots onto which different types of testing modules are selectively mounted.

2. Description of the Related Art

A testing apparatus for performing an analog test of a device under test performs the test by instructing one testing module to generate and supply a test signal to the device under test and another testing module to measure the output signal from the device under test. In order to properly operate each of a plurality of testing modules, each of a plurality of controlling modules selects and supplies both a trigger signal and a clock signal corresponding to the type of each of the testing modules among a plurality of trigger signals and clock signals to the testing module based on a testing program. In order to realize the operations of such controlling modules, one who prepares the testing program prepares a management table for managing the connections of the inputs and outputs of the controlling modules so as to arbitrarily select the trigger signals and the clock signals inputted to the controlling modules, and the trigger signals and the clock signals outputted from the controlling modules to the testing modules, and prepares a testing program for testing the device under test in consideration of the connections of inputs and outputs of the controlling modules.

Recently, a testing apparatus including a plurality of testing module slots onto which different types of testing modules for generating different types of test signals for the test of the device under test respectively are selectively mounted has been developed. In such testing apparatus, since the connection relation of the controlling modules and the testing modules are arbitrarily changed, and the times required for the test operations for the test modules are different from each other, it is inevitable to prepare a management program whenever the testing modules are changed, and a testing program corresponding to the mounting positions the testing modules whenever the testing modules are changed, and a preparation process is needed for a extremely difficult test.

SUMMARY OF THE INVENTION

Therefore, it is an object of the present invention to provide a testing apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a testing apparatus having a plurality of testing module slots onto which different types of testing modules for generating different types of test signals to test a device under test are selectively mounted, includes a plurality of controlling modules for supplying a control signal to each of the testing modules mounted on the testing module slots, the control signals being used for controlling the testing modules, setting information supplying means for supplying hardware setting information to a specific testing module among the testing modules, the hardware setting information being set in advance in the controlling module corresponding to the specific testing module, enable signal controlling means for instructing the testing module to generate and supply an enable signal to the controlling module corresponding to the specific testing module, and setting means for setting the controlling module received the enable signal from the specific testing module so as to supply the control signal corresponding to the specific testing module to the specific testing module based on the hardware setting information.

The controlling modules may include a plurality of interfaces for inputting different types of the control signals respectively. The setting information supplying means may select a specific control signal among the control signals and supplies the hardware setting information to the controlling module via a specific interface among the interfaces that inputs the specific control signal to the controlling module. The setting means may set the controlling module to supply the specific control signal to the specific testing module. The specific control signal may be inputted from the specific interface to the controlling module.

The controlling modules may further include a multiplexer circuit for selecting the specific control signal to be supplied to the specific testing module among the control signals inputted from the interfaces respectively, and a flip-flop circuit for holding information indicating that the hardware setting information is inputted from the specific interface as a select signal for controlling the multiplexer circuit to select the specific control signal, based on a setting request signal supplied from the setting means, when the enable signal is received from the specific testing module.

The control signals may be trigger signals for controlling the testing module, and the multiplexer circuit may select and supply a trigger signal to be supplied to the specific testing module among different types of the trigger signals inputted from the interfaces respectively.

The control signals may be clock signals for controlling the testing module, and the multiplexer circuit may select and supply a clock signal to be supplied to the specific testing module among different types of the clock signals inputted from the interfaces respectively.

The controlling modules may further include a first multiplexer circuit for selecting a trigger signal to be supplied to the specific testing module among different types of trigger signals for controlling the testing modules, the trigger signal being inputted from each of the interfaces as the control signal, a first flip-flop circuit for holding information indicating that the hardware setting information is inputted from the specific interface as a select signal for controlling the first multiplexer circuit to select the trigger signal, based on a setting request signal supplied from the setting means, when the enable signal is received from the specific testing module, a second multiplexer circuit for selecting a clock signal to be supplied to the specific testing module among different types of clock signals for controlling the testing modules, the clock signal being inputted from each of the interfaces as the control signal, and a second flip-flop circuit for holding information indicating that the hardware setting information is inputted from the specific interface as a select signal for controlling the second multiplexer circuit to select the clock signal, based on a setting request signal supplied from the setting means, when the enable signal is received from the specific testing module.

The testing apparatus may further include a first site controlling apparatus for controlling a first testing module among the testing modules, and a second site controlling apparatus for controlling a second testing module among the testing modules, wherein the enable signal controlling means may instruct the first testing module to generate and supply the enable signal to a first controlling module corresponding to the first testing module, and the second testing module to generate and supply the enable signal to a second controlling module corresponding to the second testing module, the setting information supplying means may supply the hardware setting information via a first interface among the interfaces, the first interface inputting the control signal generated under the control of the first site controlling apparatus to the first controlling module, and via a second interface among the interfaces, the second interface inputting the control signal generated under the control of the second site controlling apparatus to the second controlling module, and the setting means may set the first controlling module to supply the control signal to the first testing module, the control signal being inputted from the first interface to the first controlling module, and the second controlling module to supply the control signal to the second testing module, the control signal being inputted from the second interface to the second controlling module.

The testing apparatus may test a plurality of the devices under test at the same time, the enable signal controlling means may instruct a first testing module among the testing modules to generate and supply the enable signal to a first controlling module among the controlling modules, the first testing module supplying the test signal to a first device under test among the devices under test, the first controlling module supplying the control signal to the first testing module, and a second testing module among the testing modules to generate and supply the enable signal to a second controlling module among the controlling modules, the second testing module supplying the test signal to a second device under test among the devices under test, the second controlling module supplying the control signal to the second testing module, the setting information supplying means may supply the hardware setting information via a first interface among the interfaces, the first interface inputting the control signal for controlling the test of the first device under test to the first controlling module, and via a second interface among the interfaces, the second interface inputting the control signal for controlling the test of the second device under test to the second controlling module, and the setting means may set the first controlling module to supply the control signal to the first testing module, the control signal being inputted from the first interface to the first controlling module, and the second controlling module to supply the control signal to the second testing module, the control signal being inputted from the second interface to the second controlling module.

The testing modules may be analog measuring modules for performing an analog test of the device under test. The controlling modules may supply control signals to each of the analog measuring modules. The control signals may be used for controlling the analog measuring modules.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 2 shows a first example of the configuration of a trigger controlling module 114a.

FIG. 3 shows a second example of the configuration of a trigger controlling module 114a.

FIG. 4 shows a third example of the configuration of a trigger controlling module 114a.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
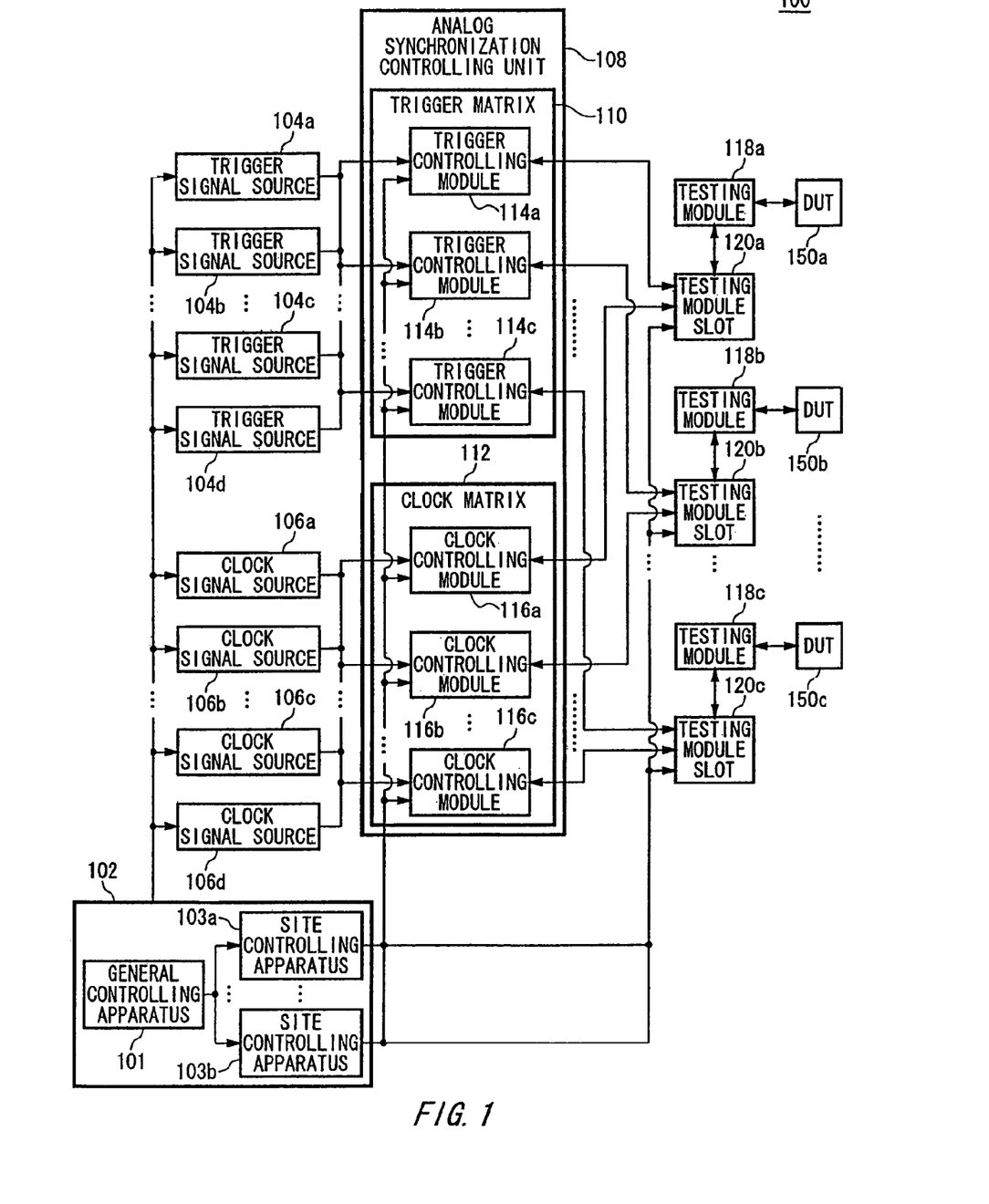
FIG. 1 shows an example of the configuration of a testing apparatus 100 related to an exemplary embodiment of the present invention.

FIG. 1 shows an example of the configuration of a testing apparatus 100 related to an exemplary embodiment of the present invention. The testing apparatus 100 includes a controlling apparatus group 102, a plurality of trigger signal sources 104a–104d, a plurality of clock signal sources 106a–106d, an analog synchronization controlling unit 108, a plurality of testing modules 118a–118c, and a plurality of testing module slots 120a–120c.

The controlling apparatus group 102 includes a general controlling apparatus 101 and a plurality of site controlling apparatuses 103a and 103b. The analog synchronization controlling unit 108 includes a trigger matrix 110 and a clock matrix 112. The trigger matrix 110 includes a plurality of trigger controlling modules 114a–114c, and the clock matrix 112 includes a plurality of clock controlling modules 116a–116c.

The testing apparatus 100 generates and supplies test signals to the devices under test 150a–150c, measures the output signals from the devices under test 150a–150c as the results of their operations corresponding to the test signals, and judges the quality of the devices under test 150a–150c based on the measurement results. The testing apparatus 100 is realized through an open architecture, where modules based on the open architecture are used as the testing modules 118a–118c for supplying the testing signals to the devices under test 150a–150c. In other words, onto the testing module slots 120a–120c, different types of testing modules 118a–118c are optionally mounted to generate different types of testing signals for the test of the devices under test 150a–150c respectively. The testing modules 118a–118c are analog measurement modules for the analog test of the devices under test 150a–150c such as arbitrary waveform adjusters for generating and supplying arbitrary analog waveforms to the devices under test 150a–150c, and phase characteristic testers for testing the phase characteristics of their analog waveforms, by receiving the analog waveforms outputted by the devices under test 150a–150c corresponding to the analog waveforms supplied from the arbitrary waveform adjusters.

Each of the trigger controlling modules 114a–114c and the clock controlling modules 116a–116c supplies trigger and clock signals to the plurality of testing modules 118a–118c in order to control the operations of the plurality of testing modules 118a–118c mounted onto the plurality of testing module slots 120a–120c respectively. The trigger and clock signals are an example of the controlling signals of the present invention.

The trigger controlling modules 114a–114c include a plurality of interfaces for the inputs of a plurality of different types of trigger signals supplied from each of the trigger signal sources 104a–104d. The clock controlling modules 116a–116c include a plurality of interfaces for the inputs of a plurality of different types of clock signals supplied from each of the clock signal sources 106a–106d. In addition, the trigger controlling modules 114a–114c receive the trigger signals generated by the trigger signal sources 104a–104d respectively, select one of the trigger signals under the control of the controlling apparatus group, and supply it to the testing modules 118a–118c. The clock controlling modules 116a–116c receive the clock signals generated by the clock signal sources 106a–106d respectively, select one of the clock signals under the control of the controlling apparatus group, and supply it to the testing modules 118a–118c. Here, the trigger signal sources 104a–104d and the clock signal sources 106a–106d are, e.g. the digital synchronization controlling unit and the performance board. In addition, the testing modules 118a–118c, the trigger controlling modules 114a–114c or the clock controlling modules 116a–116c may function as the trigger signal sources 104a–104d or the clock signal sources 106a–106d.

The general controlling apparatus 101 obtains and stores a test controlling program, a testing program, and test data used by the testing apparatus 100 to test the devices under test 150a–150c via an external network. The site controlling apparatuses 103a and 103b function as enable signal controlling means and setting means related to the present invention, so that they control the testing modules 118a–118c and test each of the devices under test 150a–150c in parallel at the same time. The connection relation between the site controlling apparatuses 103a and 103b and the testing modules 118a–118c is changed depending on the number of the pins of the devices under test 150a–150c, the shape of the wirings of the performance board, the type of the testing modules 118a–118c, etc., and the site controlling apparatuses 103a and 103b test the devices under test 150a–150c in parallel. In addition, the site controlling apparatuses 103a and 103b perform different test sequences depending on the performance of the devices under test 150a–150c. For example, the site controlling apparatus 103a controls the operations of the testing modules including the testing module 118a among the testing modules 118a–118c, whereas the site controlling apparatus 103b controls the operations of the testing modules including the testing module 118b among the testing modules 118b–118c. In other words, each of the site controlling apparatuses 103a and 103b divides the testing modules 118a–118c into the sites of the number of the site controlling apparatuses 103a and 103b to control the operations of the testing modules including each of the sites.

The site controlling apparatuses 103a and 103b obtain and perform the test controlling program from the general controlling apparatus 101. Then, the site controlling apparatuses 103a and 103b obtain the testing program and the test data used for the test of the devices under test 150a–150c from the general controlling apparatus 101 based on the test controlling program, and supply them to the testing modules 118a–118c. Then, the site controlling apparatuses 103a and 103b instruct the testing modules 118a–118c to start the test based on the testing program and the test data by supplying the trigger signals generated by the trigger signal sources 104a–104d and the clock signals generated by the clock signal sources 106a–106d towards the testing modules 118a–118c. The site controlling apparatuses 103a and 103b receive an interrupt indicating that the test is completed, and inform the general controlling apparatus 101.

Accordingly, each of the trigger controlling modules 114a–114c and the clock controlling modules 116a–116c related to this embodiment is set in advance with regard to hardware before the test of the devices under test 150a–150c starts, and thereby which signal among the trigger signals or the clock signals generated by the trigger signal sources 104a–104d or the clock signal sources 106a–106d is selected and outputted is determined.

The site controlling apparatus 103a functions as setting information supplying means, and supplies hardware setting information to be set in advance in the trigger controlling module 114a and the clock controlling module 116a in order to send the trigger and clock signals corresponding to a specific testing module 118a among the testing modules 118a–118c to the specific testing module 118a. Particularly, a status signal as an example of the hardware setting information is supplied from one of the trigger signal sources 104a–104d to the trigger controlling module 114a, whereas a status signal as an example of the hardware setting information is supplied from one of the clock signal sources 106a–106d to the clock controlling module 116a.

In other words, a specific trigger signal among the trigger signals generated by the trigger signal sources 104a–104d is selected, and the status signal is supplied to the trigger controlling module 114a via a specific interface among the interfaces included in the trigger controlling module 114a which inputs the specific trigger signal to the trigger controlling module 114a, whereas a specific clock signal among the clock signals generated by the clock signal sources 106a–106d is selected, and the status signal is supplied to the clock controlling module 116a via a specific interface among the interfaces included in the clock controlling module 116a which inputs the specific clock signal to the clock controlling module 116a.

Then, the site controlling apparatus 103a functions as enable signal controlling means of the present invention, so that it supplies an enable signal generation request to the testing module 118a via a system control bus, and instructs a specific testing module 118a to generate and supply an enable signal to the trigger controlling module 114a and the clock controlling module 116a to supply the trigger signals and the clock signals to the specific testing module 118a.

In addition, the site controlling apparatus 103a functions as setting means of the present invention, so that it sets the trigger controlling module 114a and the clock controlling module 116a having received the enable signal from the specific testing module 118a to supply the trigger signals and the clock signals corresponding to the specific testing module 118a to the specific testing module 118a based on the hardware setting information. Particularly, a setting request signal is supplied to the trigger controlling module 114a via the system control bus, and the hardware of the trigger controlling module 114a is set to supply the trigger signal inputted from the specific interface to the trigger controlling module 114a to the specific testing module 118a. A setting request signal is supplied to the clock controlling module 116a via the system control bus, and the hardware of the clock controlling module 116a is set to supply the clock signal inputted from the specific interface to the clock controlling module 116a to the specific testing module 118a.

As discussed above, since the status signals are supplied from the trigger signal sources 104a–104d to the trigger controlling modules 114a–114c and from the clock signal sources 106a–106d to the clock controlling modules 116a–116c, and the enable signals are supplied from the testing modules 118a–118c to the trigger controlling modules 114a–114c and the clock controlling modules 116a–116c, it is possible to set the connection relation of the inputs and outputs of the trigger controlling modules 114a–114c and the clock controlling modules 116a–116c of the trigger matrix 110 and the clock matrix 112 before the test of the devices under test 150a–150c starts. Accordingly, although the testing modules 118a–118c mounted onto the testing module slots 120a–120c of the testing apparatus 100 realized by an open architecture are arbitrarily changed, it is unnecessary to prepare a management table to manage the connections of the inputs and outputs of the trigger controlling modules 114a–114c and the clock controlling modules 116a–116c, and to prepare a testing program depending on the mounting positions of the testing modules 118a–118c. Therefore, the test of the devices under test 150a–150c can start quickly, and the time required to test the devices under test 150a–150c can be reduced.

Figure 2:
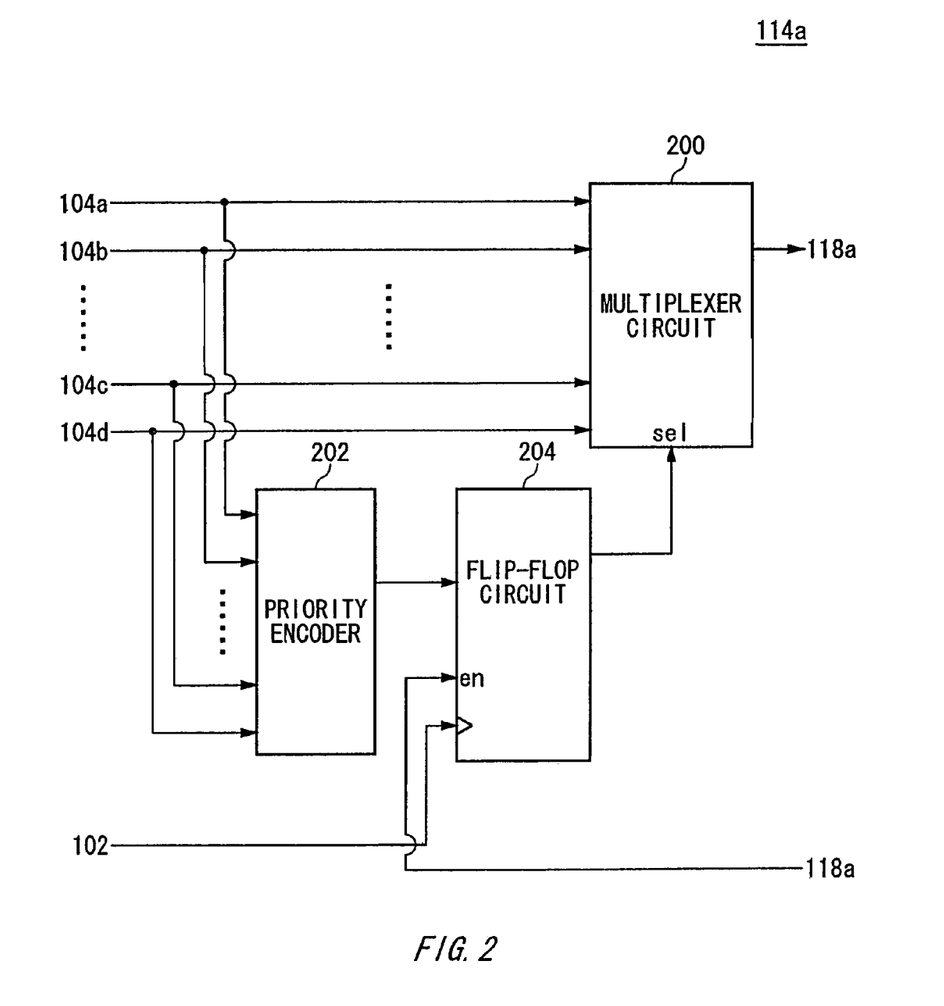

FIG. 2 shows a first example of the configuration of a trigger controlling module 114a related to this embodiment. The trigger controlling module 114a according to this embodiment includes a multiplexer circuit 200, a priority encoder 202, and a flip-flop circuit 204. The trigger controlling module 114a according to this embodiment controls the testing module 118a to supply the trigger signals corresponding to the devices under test 150a–150c by the status information held by the flip-flop circuit 204.

First, the hardware setting of the trigger controlling module 114a before the test of the devices under test 150a–150c starts will be described. When at least one of the trigger signal sources 104a–104d supplies a status signal to the trigger controlling modules 114a based on an instruction of the controlling apparatus group 102, the priority encoder 202 receives the signals supplied from the trigger signal sources 104a–104d via the interfaces, and calculates the status information indicating which trigger signal source among the trigger signal sources 104a–104d is supplying the status signal and sends it to the flip-flop circuit 204. Then, when the testing module 118a supplies an enable signal to the flip-flop circuit 204 based on an instruction of the controlling apparatus group 102, and a setting request signal is supplied from the controlling apparatus group 102 to the flip-flop circuit 204, the flip-flop circuit 204 holds the status information supplied from the priority encoder 202 as a select signal for controlling the multiplexer circuit 200 to select the control signal. Accordingly, the hardware setting of the trigger controlling module 114a is performed, and the connections of the inputs and outputs are determined.

Next, the operation of the trigger controlling module 114a during the test of the devices under test 150a–150c will be described. The flip-flop circuit 204 supplies the status information held before the test starts as described above to the multiplexer circuit 200 as the select signal. When the trigger signals generated by the trigger signal sources 104a–104d are supplied to the trigger controlling module 114a via the interfaces based on an instruction of the controlling apparatus group 102, the multiplexer circuit 200 selects a trigger signal among the trigger signals which is supplied to a specific testing module 118a based on the select signal supplied from the flip-flop circuit 204, and supplies it to the testing module 118a.

Further, the trigger controlling modules 114b and 114c have the same configuration and function as that of the trigger controlling module 114a described above. In addition, the clock controlling modules 116a–116c have the same configuration and function as that of the trigger controlling module 114a described above except the differences between the trigger signals and the clock signals. In other words, each of the clock controlling modules 116a–116c includes a multiplexer circuit, a priority encoder, and a flip-flop circuit having the same configuration and function as those of the multiplexer circuit 200, the priority encoder 202, and the flip-flop circuit 204.

According to the trigger controlling module 114a of this embodiment, before the test of the devices under test 150a–150c starts, the priority encoder 202 generates the status information, and the flip-flop circuit 204 holds it as the select signal, whereby the hardware setting of the trigger controlling modules 114a–114c and the clock controlling modules 116a–116c is performed, and thus the trigger signal sources 104a–104d and the clock signal sources 106a–106d can be properly selected corresponding to the testing modules 118a–118c to perform the test.

Figure 3:
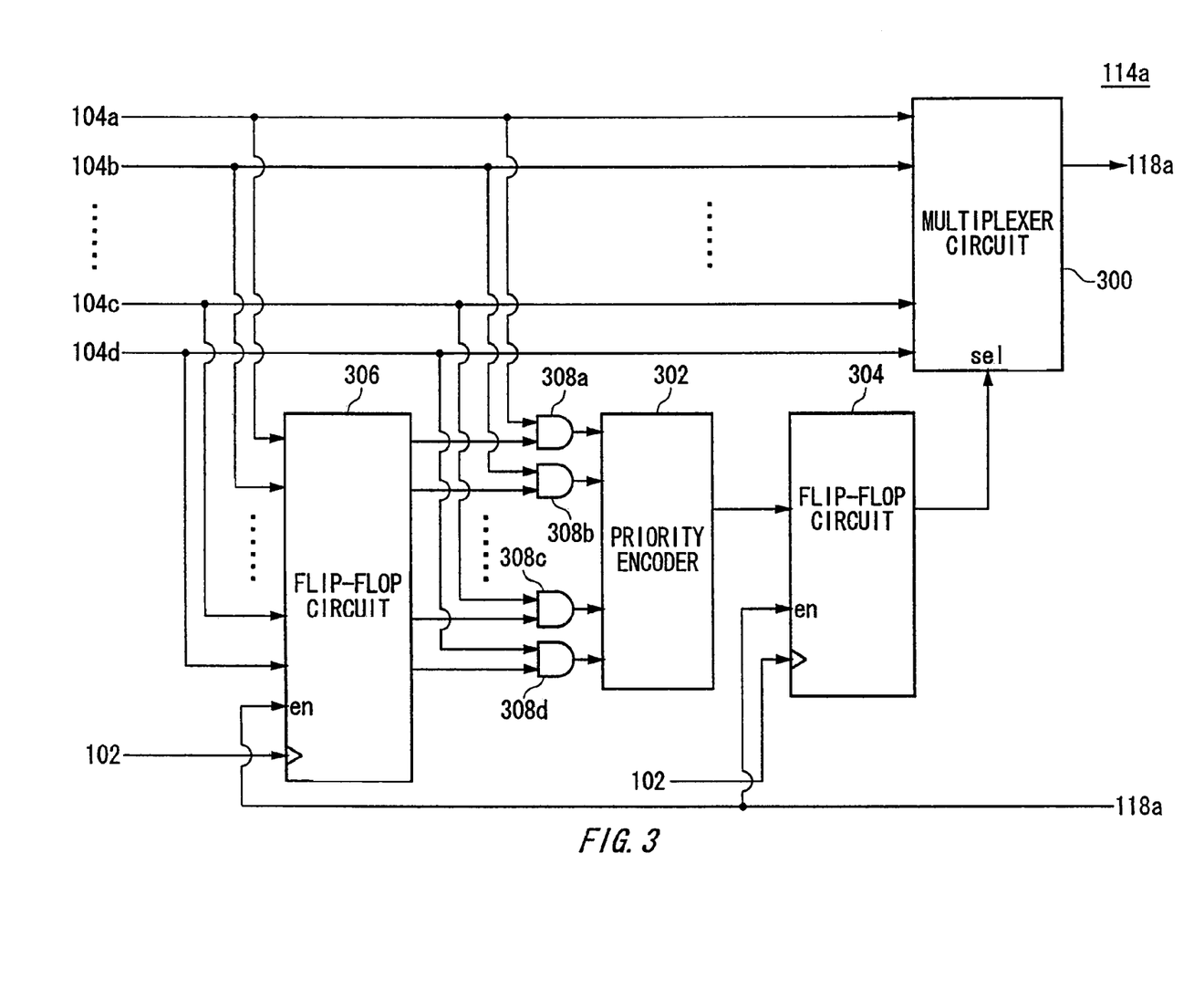

FIG. 3 shows a second example of the configuration of a trigger controlling module 114a related to this embodiment. In the testing apparatus 100 including the trigger controlling module 114a according to this embodiment, the site controlling apparatus 103a instructs the testing module 118a for supplying the test signal to the device under test 150a- generate and supply an enable signal to the trigger controlling module 114a supplying the trigger signal to the testing module 118a. The site controlling apparatus 103a supplies the hardware setting information from a first interface for inputting the trigger signal to the trigger controlling module 114a to control the test of the device under test 150a. The site controlling apparatus 103a sets the trigger controlling module 114a to supply the trigger signal inputted from the first interface to the trigger controlling module 114a to the testing module 118a. In addition, the site controlling apparatus 103a instructs the testing module 118b supplying the test signal to the device under test 150b to generate and supply an enable signal to the trigger controlling module 114b supplying the trigger signal to the testing module 118b. The site controlling apparatus 103a supplies the hardware setting information from a second interface for inputting the trigger signal to the trigger controlling module 114b to control the test of the device under test 150b. The site controlling apparatus 103a sets the trigger controlling module 114b to supply the trigger signal inputted from the second interface to the trigger controlling module 114b to the testing module 118b.

In other words, the trigger controlling module 114a according to this embodiment includes a multiplexer circuit 300, a priority encoder 302, a flip-flop circuit 304, a flip-flop circuit 306, and a plurality of AND circuits 308a–308d. And the trigger controlling module 114a according to this embodiment is controlled to supply the trigger signal whose type corresponds to the type of the devices under test 150a–150c to the testing module 118a based on the status information held by the flip-flop circuit 306, and to supply the trigger signal whose type corresponds to the testing modules 118a–118c to the testing module 118a based on the status information held by the flip-flop circuit 304.

First, the hardware setting of the trigger controlling modules 114a before the test of the devices under test 150a–150c starts will be described. When at least one of the trigger signal sources 104a–104d supplies a status signal corresponding to the type of the device 150a to be tested by the testing module 118a to the trigger controlling module 114a based on an instruction of the controlling apparatus group 102, the signal is inputted to the flip-flop circuit 306. When the testing module 118a supplies an enable signal to the flip-flop circuit 306 based on an instruction of the controlling apparatus group 102, and the controlling apparatus group 102 supplies a setting request signal to the flip-flop circuit 306, the flip-flop circuit 306 holds the signals supplied from the trigger signal sources 104a–104d as the status information which is the information to select the trigger signal corresponding to the type of the device under test 150a based on the setting request signal.

In addition, when at least one of the trigger signal sources 104a–104d supplies a status signal corresponding to the testing module 118a to the trigger controlling module 114a based on an instruction of the controlling apparatus group 102, the signal is inputted to the AND circuits 308a–308d. The flip-flop circuit 306 inputs the held status information to the AND circuits 308a–308d based on the setting request signal supplied from the controlling apparatus group 102. Each of the AND circuits 308a–308d logically multiplies each signal being supplied from the trigger signal sources 104a–104d by the status information inputted from the flip-flop circuit 306, and supplies the result to the priority encoder 302. In other words, the AND circuits 308a–308d logically multiplies a plurality of status signals supplied to the trigger controlling module 114a corresponding to the device under test 150a by a plurality of status signals supplied to the trigger controlling module 114a corresponding to the device under test 150a, and supply the results to the priority encoder 302.

Further, the priority encoder 302 receives the operation results of the status signals supplied from the AND circuits 308a–308d, and calculates and supplies the status information to the flip-flop circuit 304, where the status information indicates which trigger signal source among the trigger signal sources 104a–104d is supplying the status signal corresponding to the type of the device under test 150a and the status signal corresponding to the device under test 150a. Then when the testing module 118a supplies an enable signal to the flip-flop circuit 304 based on an instruction of the controlling apparatus group 102, and the controlling apparatus group 102 supplies a setting request signal to the flip-flop circuit 304, the flip-flop circuit 304 holds the status information being supplied from the priority encoder 302 as the select signal to control the multiplexer circuit 300 to select the control signal based on the setting request signal. Accordingly, the hardware setting of the trigger controlling module 114a is performed, and the connections of the inputs and outputs are determined.

Next, the operation of the trigger controlling module 114a during the test of the devices under test 150a–150c will be described. The flip-flop circuit 304 supplies the status information held before the test starts as described above to the multiplexer circuit 300 as the select signal. When the trigger signals generated by the trigger signal sources 104a–104d are supplied to the trigger controlling module 114a via the interfaces based on an instruction of the controlling apparatus group 102, the multiplexer circuit 300 selects a trigger signal among the trigger signals which is supplied to a specific testing module 118a based on the select signal supplied from the flip-flop circuit 304, and supplies it to the testing module 118a.

Further, the trigger controlling modules 114b and 114c have the same configuration and function as that of the trigger controlling module 114a described above. In addition, the clock controlling modules 116a–116c have the same configuration and function as that of the trigger controlling module 114a described above except the differences between the trigger signals and the clock signals. In other words, each of the clock controlling modules 116a–116c includes a multiplexer circuit, a priority encoder, a flip-flop circuit, a flip-flop circuit, and a plurality of AND circuits having the same configuration and function as those of the multiplexer circuit 300, the priority encoder 302, the flip-flop circuit 304, the flip-flop circuit 306, and the AND circuits 308a–308d.

According to the trigger controlling module 114a of this embodiment, before the test of the devices under test 150a–150c starts, the flip-flop circuit 306 and the priority encoder 302 generate the status information, and the flip-flop circuit 304 holds it as the select signal, whereby the hardware setting of the trigger controlling modules 114a–114c and the clock controlling modules 116a–116c can be performed. Further, the trigger signal sources 104a–104d and the clock signal sources 106a–106d can be properly selected corresponding to the type of the devices under test 150a–150c and the testing modules 118a–118c to perform the test.

Figure 4:
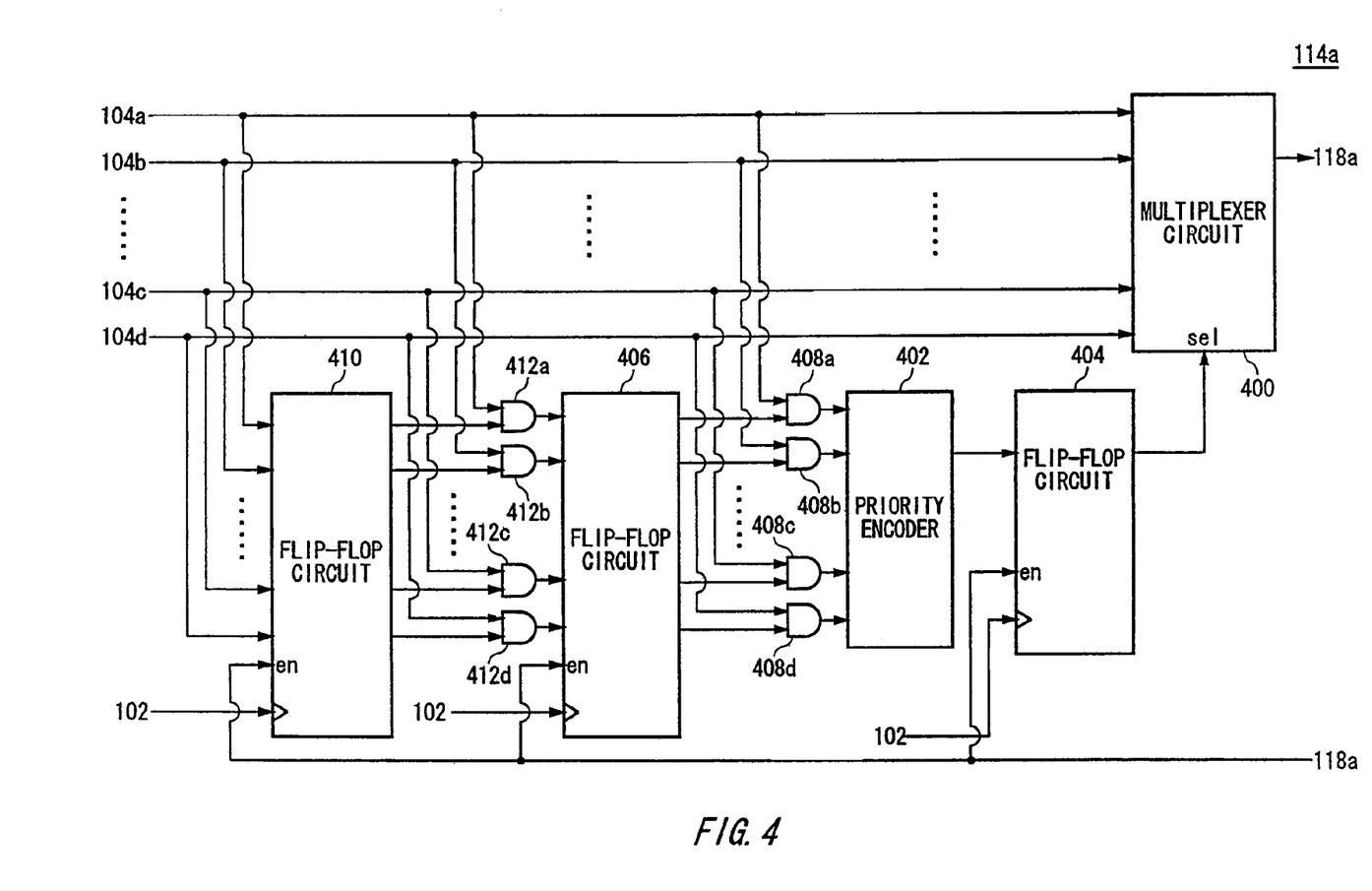

FIG. 4 shows a third example of the configuration of a trigger controlling module 114a related to this embodiment. In the testing apparatus 100 including the trigger controlling module 114a according to this embodiment, the controlling apparatus group 102 instructs the testing module 118a included in a first site controlled by the site controlling apparatus 103a to generate and supply an enable signal to the trigger controlling module 114a supplying the trigger signal to the testing module 118a. The controlling apparatus group 102 supplies the hardware setting information from a first interface for inputting the trigger signal generated on the basis of the control of the site controlling apparatus 103a to the trigger controlling module 114a to control the test of the device under test 150a. Also, the controlling apparatus group 102 sets the trigger controlling module 114a to supply the control signal inputted from the first interface to the trigger controlling module 114a to the testing module 118a. In addition, the controlling apparatus group 102 instructs the testing module 118b included in a second site controlled the site controlling apparatus 103b to generate and supply an enable signal to the trigger controlling module 114b supplying the trigger signal to the testing module 118b. The controlling apparatus group 102 supplies the hardware setting information generated on the basis of the control of the site controlling apparatus 103b from a second interface for inputting the trigger signal to the trigger controlling module 114b. Then, the controlling apparatus group 102 sets the trigger controlling module 114b to supply the control signal inputted from the second interface to the trigger controlling module 114b to the trigger controlling module 114b.

Further, the site controlling apparatus 103a instructs the testing module 118a for supplying the test signal to the device under test 150a-generate and supply an enable signal to the trigger controlling module 114a supplying the trigger signal to the testing module 118a. The site controlling apparatus 103a supplies the hardware setting information from a first interface for inputting the trigger signal to the trigger controlling module 114a to control the test of the device under test 150a. The site controlling apparatus 103a sets the trigger controlling module 114a to supply the trigger signal inputted from the first interface to the trigger controlling module 114a to the testing module 118a. In addition, the site controlling apparatus 103b instructs the testing module 118b supplying the test signal to the device under test 150b to generate and supply an enable signal to the trigger controlling module 114b supplying the trigger signal to the testing module 118b. Further, the site controlling apparatus 103b supplies the hardware setting information from a second interface for inputting the trigger signal to the trigger controlling module 114b to control the test of the device under test 150b. Then, the site controlling apparatus 103b sets the trigger controlling module 114b to supply the trigger signal inputted from the second interface to the trigger controlling module 114b to the testing module 118b.

In other words, the trigger controlling module 114a according to this embodiment includes a multiplexer circuit 400, a priority encoder 402, a flip-flop circuit 404, a flip-flop circuit 406, a plurality of AND circuits 408a–408d, a flip-flop circuit 410, and a plurality of AND circuits 412a–412d. The trigger controlling module 114a according to this embodiment is controlled to supply the trigger signal whose type corresponds to the type of the site controlling apparatuses 103a and 103b to the testing module 118a based on the status information held by the flip-flop circuit 410, the trigger signal whose type corresponds to the type of the devices under test 150a–150c to the testing module 118a based on the status information held by the flip-flop circuit 306, and the trigger signal whose type corresponds to the testing modules 118a–118c to the testing module 118a based on the status information held by the flip-flop circuit 404.

First, the hardware setting of the trigger controlling modules 114a before the test of the devices under test 150a–150c starts will be described. When at least one of the trigger signal sources 104a–104d supplies a status signal corresponding to the type of the site controlling apparatus 103a to the trigger controlling module 114a based on an instruction of the controlling apparatus group 102, the signal is inputted to the flip-flop circuit 410. When the testing module 118a supplies an enable signal to the flip-flop circuit 410 based on an instruction of the controlling apparatus group 102, and the controlling apparatus group 102 supplies a setting request signal to the flip-flop circuit 410, the flip-flop circuit 410 holds the signals supplied from the trigger signal sources 104a–104d as the status information which is the information to select the trigger signal corresponding to the type of the site controlling apparatus 103a based on the setting request signal.

In addition, when at least one of the trigger signal sources 104a–104d supplies a status signal corresponding to the type of the device under test 150a to the trigger controlling module 114a based on an instruction of the controlling apparatus group 102, the signal is inputted to the AND circuits 412a–412d. Further, the flip-flop circuit 410 inputs the held status information to the AND circuits 412a–412d based on the setting request signal supplied from the controlling apparatus group 102. Each of the AND circuits 412a–412d logically multiplies each signal being supplied from the trigger signal sources 104a–104d by the status information inputted from the flip-flop circuit 406, and supplies the result to the flip-flop circuit 406. In other words, the AND circuits 412a–412d logically multiplies a plurality of status signals supplied to the trigger controlling module 114a corresponding to the type of the site controlling apparatus 103a by a plurality of status signals supplied to the trigger controlling module 114a corresponding to the type of the device under test 150a, and supply the results to the flip-flop circuit 406.

When the testing module 118a supplies an enable signal to the flip-flop circuit 406 based on an instruction of the controlling apparatus group 102, and a setting request signal is supplied from the controlling apparatus group 102 to the flip-flop circuit 406, the flip-flop circuit 406 holds the signals supplied from the AND circuits 412a–412d as the status information which is the information to select the trigger signal corresponding to the types of the site controlling apparatus 103a and the device under test 150a based on the setting request signal.

In addition, when at least one of the trigger signal sources 104a–104d supplies a status signal corresponding to the testing module 118a to the trigger controlling module 114a based on an instruction of the controlling apparatus group 102, the signal is inputted to the AND circuits 408a–408d. Further, the flip-flop circuit 406 inputs the held status information to the AND circuits 408a–408d based on the setting request signal supplied from the controlling apparatus group 102. Each of the AND circuits 408a–408d logically multiplies each signal being supplied from the trigger signal sources 104a–104d by the status information inputted from the flip-flop circuit 406, and supplies the result to the priority encoder 402. In other words, the AND circuits 408a–408d logically multiplies the result of logically multiplying a plurality of status signals supplied to the trigger controlling module 114a corresponding to the type of the site controlling apparatus 103a by a plurality of status signals supplied to the trigger controlling module 114a corresponding to the type of the device under test 150a by a plurality of status signals supplied to the trigger controlling module 114a corresponding to the device under test 150a, and supply the results to the priority encoder 402.

Further, the priority encoder 402 receives the operation results of the status signals supplied from the AND circuits 408a–408d, and calculates and supplies the status information to the flip-flop circuit 404, where the status information indicates which trigger signal source among the trigger signal sources 104a–104d is supplying the status signal corresponding to the type of the site controlling apparatus 103a, the status signal corresponding to the type of the device under test 150a, and the status signal corresponding to the testing module 118a. Then when the testing module 118a supplies an enable signal to the flip-flop circuit 404 based on an instruction of the controlling apparatus group 102, and the controlling apparatus group 102 supplies a setting request signal to the flip-flop circuit 404, the flip-flop circuit 404 holds the status information being supplied from the priority encoder 402 as the select signal to control the multiplexer circuit 400 to select the control signal based on the setting request signal. Accordingly, the hardware setting of the trigger controlling module 114a is performed, and the connections of the inputs and outputs are determined.

Next, the operation of the trigger controlling module 114a during the test of the devices under test 150a–150c will be described. The flip-flop circuit 404 supplies the status information held before the test starts as described above to the multiplexer circuit 400 as the select signal. And when the trigger signals generated by the trigger signal sources 104a–104d are supplied to the trigger controlling module 114a via the interfaces based on an instruction of the controlling apparatus group 102, the multiplexer circuit 400 selects a trigger signal among the trigger signals which is supplied to a specific testing module 118a based on the select signal supplied from the flip-flop circuit 404, and supplies it to the testing module 118a.

Further, the trigger controlling modules 114b and 114c have the same configuration and function as that of the trigger controlling module 114a described above. In addition, the clock controlling modules 116a–116c have the same configuration and function as that of the trigger controlling module 114a described above except the differences between the trigger signals and the clock signals. In other words, each of the clock controlling modules 116a–116c includes a multiplexer circuit, a priority encoder, a flip-flop circuit, a flip-flop circuit, a plurality of AND circuits, a flip-flop circuit, a plurality of AND circuits and having the same configuration and function as those of the multiplexer circuit 400, the priority encoder 402, the flip-flop circuit 404, the flip-flop circuit 406, the AND circuits 408a–408d, the flip-flop circuit 410, and the AND circuits 412a–412d.

According to the trigger controlling module 114a of this embodiment, before the test of the devices under test 150a–150c starts, the flip-flop circuit 410, the flip-flop circuit 406 and the priority encoder 402 generate the status information, and the flip-flop circuit 404 holds it as the select signal, whereby the hardware setting of the trigger controlling modules 114a–114c and the clock controlling modules 116a–116c can be performed. Further, the trigger signal sources 104a–104d and the clock signal sources 106a–106d can be properly selected corresponding to the type of the site controlling apparatuses 103a and 103b, the type of the devices under test 150a–150c and the testing modules 118a–118c to perform the test.

As discussed above, according to the testing apparatus 100 of this embodiment realized by an open architecture, even though the testing modules 118a–118c are mounted onto arbitrary positions, it is possible to control the connections of the inputs and outputs of the trigger controlling modules 114a–114c and the clock controlling modules 116a–116c easily and accurately. Accordingly, since none of management table for managing the connections of the inputs and outputs of the trigger controlling modules 114a–114c and the clock controlling modules 116a–116c and testing program depending on the mounting positions of the testing modules 118a–118c is necessary to be prepared in contrast to the testing apparatus related to the prior art. Thus, time required to test the devices under test 150a–150c can be reduced.

Although the present invention has been described by way of exemplary embodiments, it should be understood that those skilled in the art might make many changes and substitutions without departing from the spirit and the scope of the present invention which is defined only by the appended claims.

What is claimed is:

1. A testing apparatus having a plurality of testing module slots onto which different types of testing modules for generating different types of test signals to test a device under test are selectively mounted, comprising:
    a plurality of controlling modules for supplying control signals to each of said testing modules mounted on said testing module slots, said control signals being used for controlling said testing modules;
    setting information supplying means for supplying hardware setting information to a specific testing module among said testing modules, said hardware setting information being set in advance in said controlling module corresponding to said specific testing module;
    enable signal controlling means for instructing said specific testing module to generate and supply an enable signal to said controlling module corresponding to said specific testing module; and
    setting means for setting said controlling module received said enable signal from said specific testing module so as to supply said control signal corresponding to said specific testing module to said specific testing module based on said hardware setting information.

2. A testing apparatus as claimed in claim 1, wherein at least one of said plurality of controlling modules comprises a plurality of interfaces for inputting different types of said control signals respectively,
    said setting information supplying means selects a specific control signal among said control signals and supplies said hardware setting information to said controlling module corresponding to said specific testing module via a specific interface among said interfaces that inputs said specific control signal to said controlling module, and
    said setting means sets said controlling module received said enable signal from said specific testing module so as to supply said specific control signal to said specific testing module, said specific control signal being inputted from said specific interface to said controlling module.

3. A testing apparatus as claimed in claim 2, wherein the at least one of said plurality of controlling module further comprises:
    a multiplexer circuit for selecting said specific control signal to be supplied to said specific testing module among said control signals inputted from said interfaces respectively; and
    a flip-flop circuit for holding information indicating that said hardware setting information is inputted from said specific interface as a select signal for controlling said multiplexer circuit to select said specific control signal, based on a setting request signal supplied from said setting means, when said enable signal is received from said specific testing module.

4. A testing apparatus as claimed in claim 3, wherein said control signals are trigger signals for controlling said testing modules, and
    said multiplexer circuit selects and supplies a specific trigger signal to be supplied to said specific testing module among different types of said trigger signals inputted from said interfaces respectively.

5. A testing apparatus as claimed in claim 3, wherein said control signals are clock signals for controlling said testing modules, and
    said multiplexer circuit selects and supplies a specific clock signal to be supplied to said specific testing module among different types of said clock signals inputted from said interfaces respectively.

6. A testing apparatus as claimed in claim 2, wherein the at least one of said plurality of controlling modules further comprises:
    a first multiplexer circuit for selecting a specific trigger signal to be supplied to said specific testing module among different types of trigger signals for controlling said testing modules, said trigger signals being inputted from each of said interfaces as said control signals;
    a first flip-flop circuit for holding information indicating that said hardware setting information is inputted from said specific interface as a select signal for controlling said first multiplexer circuit to select said specific trigger signal, based on a setting request signal supplied from said setting means, when said enable signal is received from said specific testing module;
    a second multiplexer circuit for selecting a specific clock signal to be supplied to said specific testing module among different types of clock signals for controlling said testing modules, said clock signals being inputted from each of said interfaces as said control signals; and
    a second flip-flop circuit for holding information indicating that said hardware setting information is inputted from said specific interface as a select signal for controlling said second multiplexer circuit to select said specific clock signal, based on a setting request signal supplied from said setting means, when said enable signal is received from said specific testing module.

7. A testing apparatus as claimed in claim 2, further comprising:
    a first site controlling apparatus for controlling a first testing module among said testing modules; and
    a second site controlling apparatus for controlling a second testing module among said testing modules,
    wherein said enable signal controlling means instructs said first testing module to generate and supply said enable signal to a first controlling module corresponding to said first testing module, and said second testing module to generate and supply said enable signal to a second controlling module corresponding to said second testing module, said setting information supplying means supplies said hardware setting information via a first interface among said interfaces that inputs a first control signal generated under control of said first site controlling apparatus to said first controlling module, and via a second interface among said interfaces that inputs a second control signal generated under control of said second site controlling apparatus to said second controlling module, and said setting means sets said first controlling module so as to supply said first control signal to said first testing module, said first control signal being inputted from said first interface to said first controlling module, and sets said second controlling module so as to supply said second control signal to said second testing module, said second control signal being inputted from said second interface to said second controlling module.

8. A testing apparatus as claimed in claim 2, wherein said testing apparatus tests a plurality of said devices under test substantially concurrently, said enable signal controlling means instructs a first testing module among said testing modules to generate and supply said enable signal to a first controlling module among said controlling modules, said first testing module supplying said test signal to a first device under test among said devices under test, said first controlling module supplying said control signal to said first testing module, and a second testing module among said testing modules to generate and supply said enable signal to a second controlling module among said controlling modules, said second testing module supplying said test signal to a second device under test among said devices under test, said second controlling module supplying said control signal to said second testing module, said setting information supplying means supplies said hardware setting information via a first interface among said interfaces, said first interface inputting a first control signal for controlling a test of said first device under test to said first controlling module, and via a second interface among said interfaces, said second interface inputting a second control signal for controlling a test of said second device under test to said second controlling module, and said setting means sets said first controlling module so as to supply said first control signal to said first testing module, said first control signal being inputted from said first interface to said first controlling module, and said second controlling module so as to supply said second control signal to said second testing module, said second control signal being inputted from said second interface to said second controlling module.

9. A testing apparatus as claimed in claim 1, wherein said testing modules are analog measuring modules for performing an analog test of said device under test, and said controlling modules supply said control signals to each of said analog measuring modules, said control signals being used for controlling said analog measuring modules.

* * * * *